United States Patent [19]

Meyer et al.

[11] Patent Number: 5,793,787
[45] Date of Patent: Aug. 11, 1998

[54] TYPE II QUANTUM WELL LASER WITH ENHANCED OPTICAL MATRIX

[75] Inventors: Jerry R. Meyer, Catonsville; Craig A. Hoffman, Columbia; Filbert J. Bartoli, Upper Marlboro, all of Md.

[73] Assignee: The United States of America as represented by the Secretary of the Navy, Washington, D.C.

[21] Appl. No.: 585,612

[22] Filed: Jan. 16, 1996

[51] Int. Cl.$^6$ ............................................. H01S 3/19
[52] U.S. Cl. ............................................. 372/45; 372/43
[58] Field of Search ................................. 372/45, 43

[56] References Cited

U.S. PATENT DOCUMENTS

| | | | |
|---|---|---|---|
| 5,005,176 | 4/1991 | Lam et al. | 372/10 |
| 5,079,601 | 1/1992 | Esaki et al. | 372/45 |
| 5,381,434 | 1/1995 | Bhat et al. | 372/45 |
| 5,390,208 | 2/1995 | Kasukawa et al. | 372/45 |
| 5,451,552 | 9/1995 | Miles et al. | 437/248 |
| 5,588,015 | 12/1996 | Yang | 372/45 |

OTHER PUBLICATIONS

Chow et al., Mid–wave infrared diode lasers based on GaInSb/InAs and InAs/AlSb superlattices, Appl Phys. Lett. 67 (25), pp. 3700 –3702, (Dec. 18, 1995).

Miles et al., Midwave infrared stinulated emission from a GaInSb/LnAs superlattice, Appl. Phys. Lett. 66 (15), pp. 1921 –1923, (Apr. 10, 1995).

Hasenber et al., Demonstration of 3.5 μm $Ga_{1-x}In_xSb/InAs$ superlattice diode laser, Electron Lett. 31 pp. 275 (1995) (Jan. 3).

Le et al., High–efficiency, high–temperature, mid–infrared ($\lambda \geq 4\mu m$) InAsSb/GaSb lasers, Electronics Letters, vol. 30, No. 23, pp. 1944–1945 (Nov. 10, 1994).

Grein et al., Theoretical performance of $InAs/In_xGa_{1-x}Sb$ superlattice–based midwave infrared lasers, J. Appl. Phys. 76 (3), pp. 1940 –1942, (Aug. 1, 1994).

Flatte et al., Theoretical performance limits of 2.1–4.1 μm InAs/InGaSb, HgCdTe, and InGaAsSb laser, J. Appl Phys. 78 (7), pp. 4552 –4559 (Oct. 1, 1995).

Youngdale et al., Auger lifetime enhancement in $InAs-Ga_{1-x}In_xSb$ superlattices, Appl. Phys. Lett. 64 (23) pp. 3160 – 3162 (Jun. 6, 1994).

Meyer et al. Type–II quantum–well lasers for the mid–wavelength infrared, App. Phys. Lett. 67 (6), pp. 757 –759, (Aug. 7, 1995).

Ram–Mohen et al., Multiband Finite Element Modeling of Wavefunction–Engineered Electro–Optical Devices, Journal of Nonlinear Optical Physics and Materials vol. 4, No. 1, pp. 191 –243 (1995).

*Primary Examiner*—Rodney B. Bovernick
*Assistant Examiner*—Yisun Song
*Attorney, Agent, or Firm*—Thomas E. McDonnell; John J. Karasek

[57] ABSTRACT

A type II multiple quantum well, 4 constituent active region, optically clad electrically pumped and optically pumped laser for emitting at a wavelength greater than or equal to about 2.5 microns is disclosed. The active region comprises one or more periods, each period further comprising a barrier layer, a first conduction band layer, a valence band layer and a second conduction band layer.

29 Claims, 10 Drawing Sheets

PRIOR ART

TYPE II QUANTUM WELL LASER WITH ENHANCED OPTICAL MATRIX

BACKGROUND OF THE INVENTION

1. Field of the Invention

The present invention relates to semiconductor lasers and particularly to electrically-pumped and optically-pumped semiconductor lasers for mid-wave infrared (MWIR) and long-wave infrared (LWIR) wavelengths with possible applications of the same concepts to other wavelength regions. More particularly, the present invention relates to diode lasers and optically pumped lasers wherein a novel active layer configuration is used to increase gain, power output, reduce threshold input power and increase the operating temperature.

2. Description of the Related Art

There is a rapidly-growing demand for efficient MWIR diode lasers operating either at ambient or at temperatures accessible with a thermoelectric cooler (T≧180K). Military needs center on infrared (IR) countermeasures and communications, while high-volume commercial applications include remote chemical sensing for pollution and drug monitoring, leak detection, chemical process control, and laser surgery. In both markets, system development cannot proceed until improved MWIR sources become available.

Despite reports of dramatic improvements in the performance of diode lasers emitting at IR wavelengths out to about 2.5 microns, the development of longer-wavelength diodes with high output powers and non-cryogenic operating temperatures has proven to be much more challenging. Fundamental mechanisms limiting the performance of previous diode lasers operating at MWIR wavelengths≧3 microns have included inadequate electrical confinement due to small conduction and/or valence band offsets, and the increasing predominance of Auger recombination when the energy gap is lowered and the temperature raised.

Since the achievement of gain requires strong optical coupling between the conduction and valence band states, virtually all of the quantum well lasers developed previously have employed well and barrier constituents having a Type-I band alignment, i.e., the conduction-band minimum (CBM) and valence-band maximum (VBM) are in the same layer. Grein et al. at the University of Illinois at Chicago (UIC) and Harvard have recently discussed using Type-II InAs-Ga$_{1-x}$In$_x$Sb superlattices for MWIR lasers. See C. H. Grein, P. M. Young and H. Ehrenreich, *J. Appl. Phys.*, 76, pp. 1940, (1994), incorporated herein by reference in its entirety and for all purposes. Using the UIC/Harvard design, investigators at Hughes Research Labs have quite recently achieved the lasing of Type-II InAs-Ga$_{0.75}$In$_{0.25}$Sb superlattices emitting at 3.0–4.5 microns, using both optical injection and electrical injection.

Figure 1:
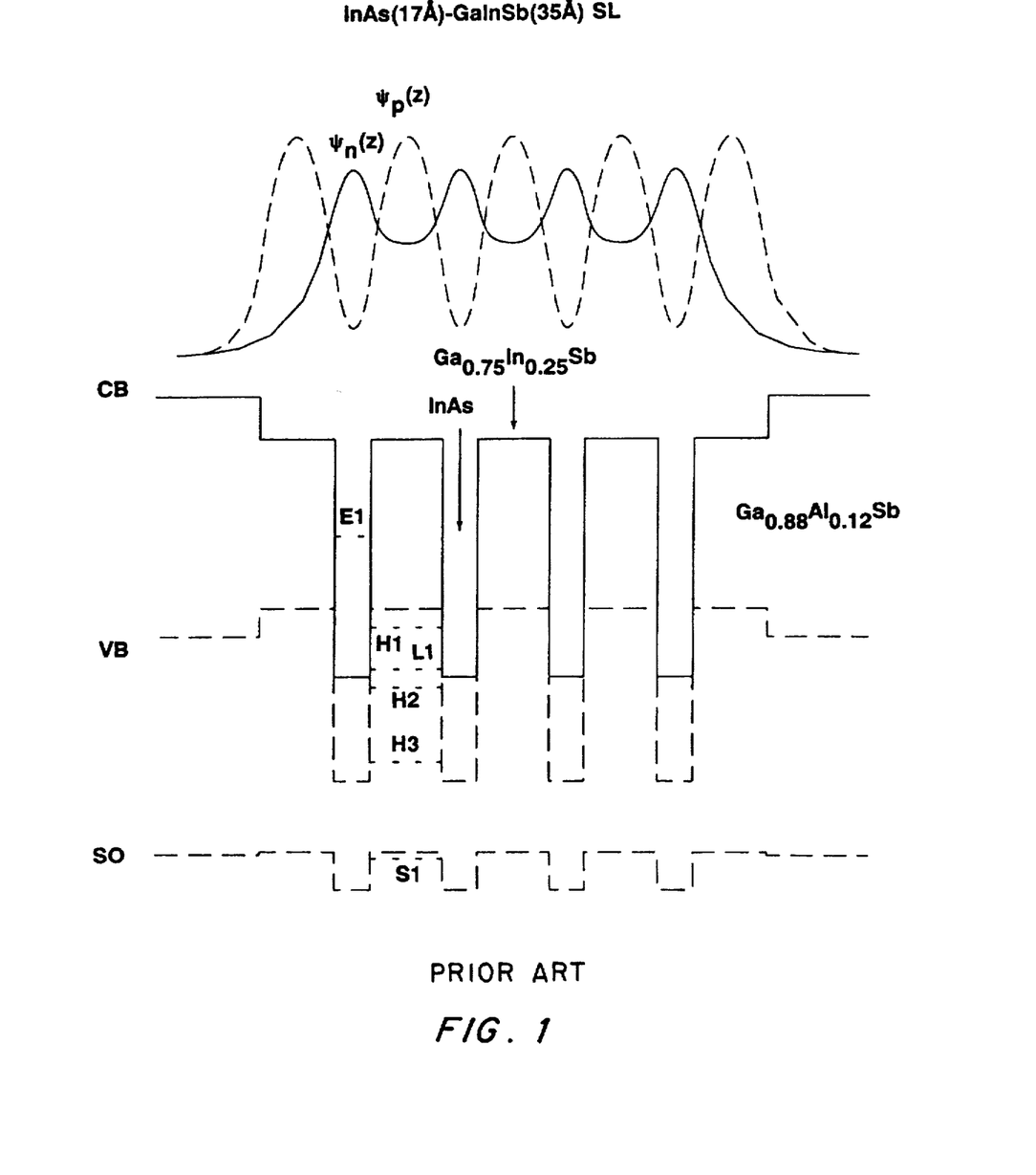
FIG. 1 depicts conduction band (solid line marked as CB), valence band (dashed line marked as VB) and split-off band (dashed line marked as SO) profiles for the Type II InAs-Ga$_{0.75}$In$_{0.25}$Sb laser (clad by Ga$_{0.88}$Al$_{0.12}$Sb) of the UIC/Harvard or Hughes design. For the UIC/Harvard SL laser, a large number of periods, n1, are present, whereas, for the Hughes structure, n1 is finite, typically, 4 and n2 is typically 5. Also shown are 8-band FEM (Multiband finite element modeling) results for the electron wavefunction (solid wavefunction) and the hole wavefunction (dashed wavefunction), along with energy minima for the various conduction and valence subbands. Note that the electrons have a three dimensional dispersion with a nearly isotropic effective mass in a SL or n1 nondegenerate levels in the structure with a finite number of periods, typically, n1=4.
Figure 2:
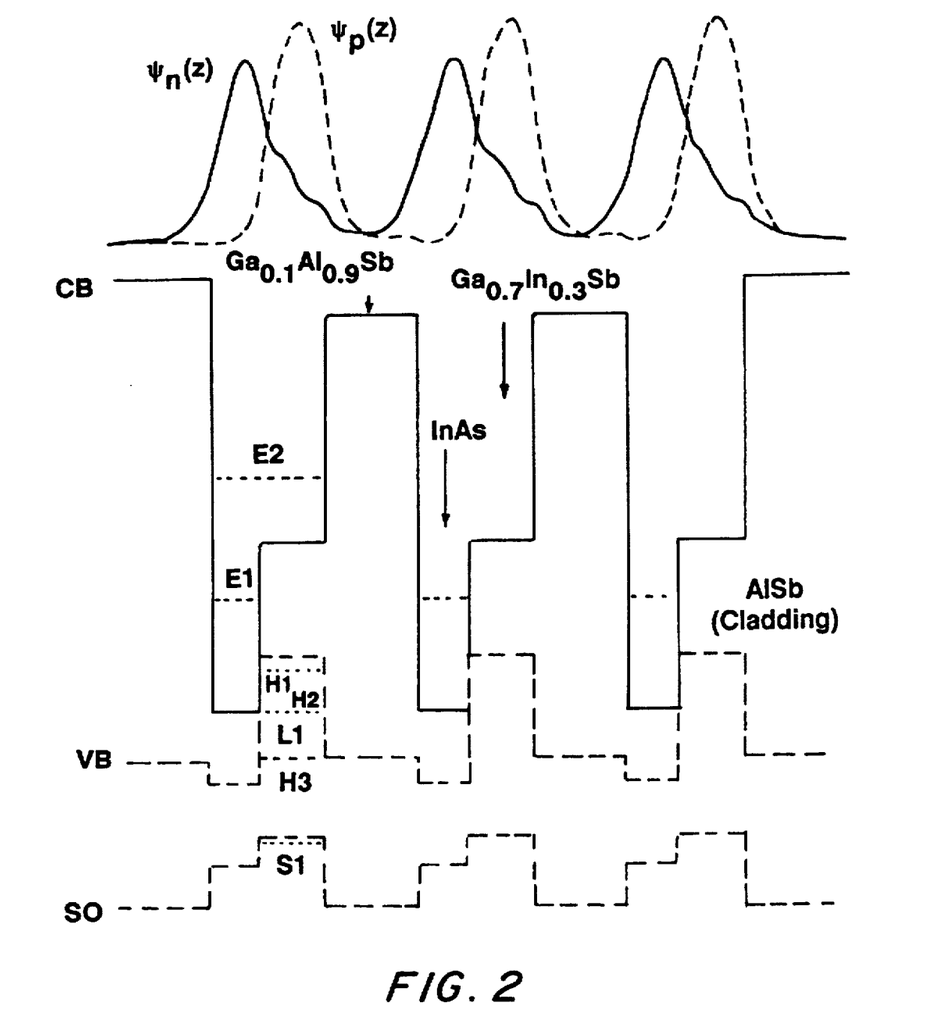
FIG. 2 depicts band profiles and FEM wavefunctions and energy levels for a Type II InAs-Ga$_{0.70}$In$_{0.30}$Sb-Ga$_{0.1}$Al$_{0.9}$Sb three-constituent multiple well which is lattice-matched to the AlSb cladding layers. Although the electrons now have a 2 dimensional dispersion due to the Ga$_{0.1}$Al$_{0.9}$Sb barrier layers, the wavefunction overlap (i.e.

The conduction, valence, and split-off band profiles for the InAs-Ga$_{1-x}$In$_x$Sb superlattices considered by UIC/ Harvard and Hughes are illustrated in FIG. 1, infra. See also L. R. Ram-Mohan and J. R. Meyer, *Multiband Finite Element Modeling of Wavefunctions-Engineered Electro-Optical Devices*, Vol., 4, No. 1, pp. 191–243 (1995), incorporated herein by reference in its entirety and for all purposes (See FIG. 2 therein). Also shown are the corresponding energy levels and wavefunctions calculated using an 8-band finite-element algorithm. Note first that even though the electron wavefunctions (solid curves) have their maxima in the InAs layers and the hole wavefunctions (dashed curves) are centered on the Ga$_{1-x}$In$_x$Sb layers, there is significant overlap because each (particularly $\psi_n$) penetrates into the adjacent layers. Hence the optical matrix element is nearly as large as values typically obtained for Type-I heterostructures. Also, the resonance between E$_g$ (the separation of E1 and H1) and $\Delta_0$ (the difference between H1 and S1) is completely removed by the Type-II band alignment, even though it is present in bulk InAs and GaSb. Furthermore, Grein et al. pointed out that for these particular layer thicknesses, the energy gap does not resonate with any intervalence transitions involving H1 near its maximum (it falls approximately halfway between H1–H2 and H1–H3). Hence all multi-hole Auger processes are energetically unfavorable, and CCCH events (in which the CH recombination is accompanied by an electron transition to a higher-energy conduction-band state (CC)) will probably dominate the nonradiative lifetime.

Figure 5:
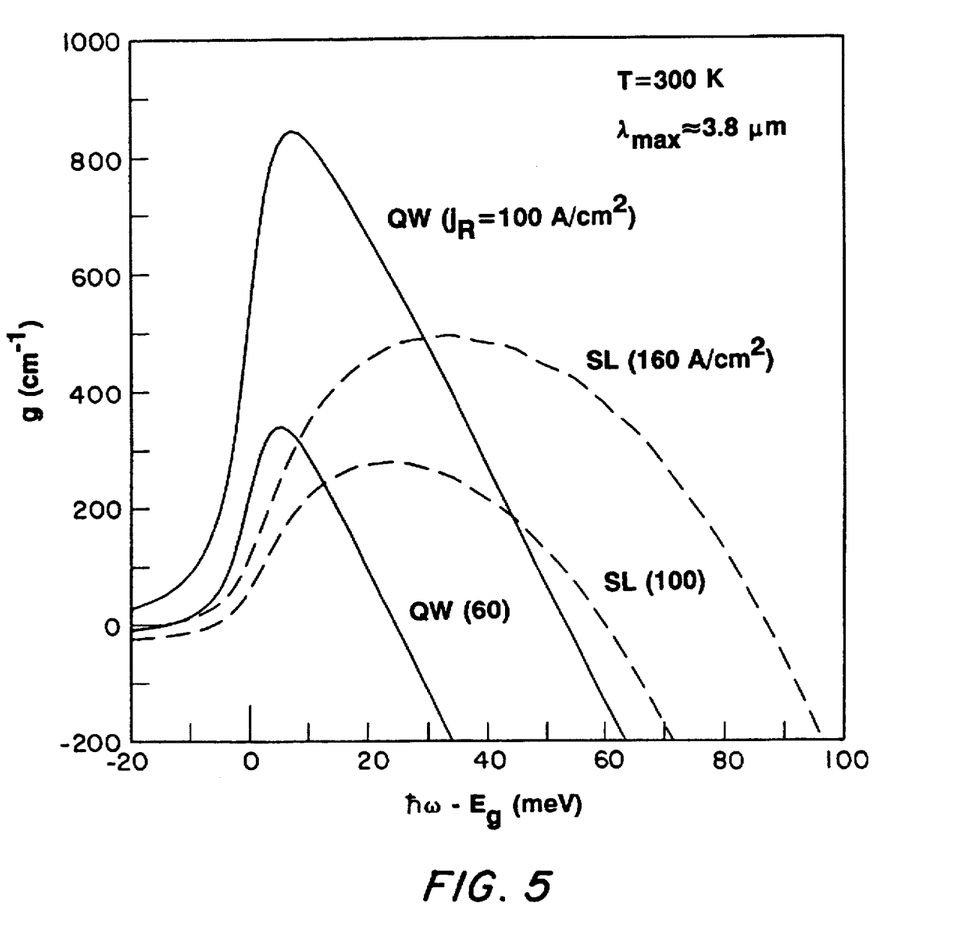
FIG. 5 is a plot of calculated gain versus photon energy (relative to the energy gap) for the superlattice structure (dashed curve) and the exemplary multiple quantum well laser structure from FIGS. 3 and 4 (solid curve) at 300 degrees Kelvin. The active region thickness in all cases is 1400 Angstoms. See Meyer et al., Type-II quantum well lasers for the mid-wavelength infrared, Appl. Phys. Lett., Vol. 67 (6), pp. 757-759 (Aug. 7, 1995), incorporated herein by reference in its entirety and for all purposes. See especially Equation (1) and FIG. (2) from Meyer et al., supra.
Figure 6:
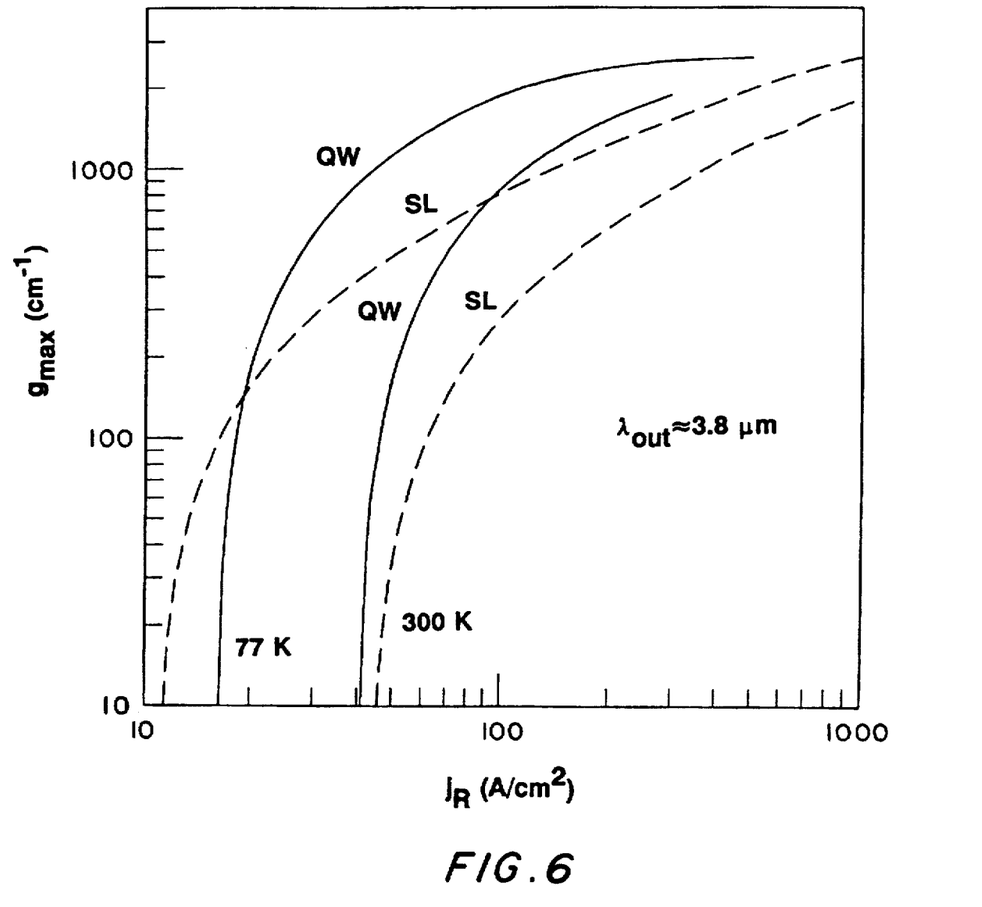
FIG. 6 is a plot of calculated gain versus pump current for the superlattice structure (dasehd curves) and the exemplary multiple quantum well structure according to FIGS. 3 and 4 (solid curves) at 77 degrees Kelving and at 300 degrees Kelvin, respectively. See Equations (2) and (3) and FIG. 3 of Meyer et al., supra.

However, the structure depicted in FIG. 1 is non-optimal in that the electron dispersion is effectively three-dimensional. While the holes in the Type-II superlattice depicted in FIG. 1, infra, have relatively small dispersion along the growth axis, the strong penetration of the electron wavefunction into the thin Ga$_{1-x}$In$_x$Sb barriers leads to a nearly isotropic electron mass (m$_{nz}$/m$_{n\perp}$≈1.2). Due to the three-dimensional electron dispersion, the gain, of Type II-superlattice lasers, is reduced (See dashed lines of FIGS. 5 and 6, infra, wherein the dashed lines indicate the gain as a function of photon energy (relative to energy gap) and maximum gain as a function of pump power, respectively, for the Type II superlattice (SL) structure). In addition, due to the three-dimensonal electron dispersion of the Type II superlattice structure the Type II superlattice (SL) structure produces a lower gain at the same operating temperature than a Type II-quantum well structure with a two dimensional electron dispersion.

Note that the laser design in FIG. 1, infra, is consistent with the Hughes design. Hughes has performed experiments on Type II lasers whose structures are intermediate between a superlattice and a quantum well. The Hughes design has a finite number, n1, of InAs layers and a finite number, n2, of GaInSb layers. Typically, n1 is 4 and n2 is 5. In that case, there is not true three-dimensional dispersion along the growth axis, but nonetheless, the conduction ground state splits into n1 non-degenerate levels and the valence ground state splits into n2 non-degenerate levels. Typically, all of the n2 valence states will be occupied with holes under lasing conditions and n1≧2 conduction states will be occupied with electrons at normal operating temperatures. However, since lasing transitions will occur only between the lowest conduction ground state and some valence state, any electrons injected into higher states are wasted, which reduces the gain. Also, there will be no lasing transitions between conduction states and holes occupying some of the n2 valence states. Thus, a Hughes structure with n1≧3 and n2≧2 will have some of the same disadvantages of a superlattice with a three-dimensional dispersion even though the Hughes structure is not strictly a superlattice structure.

Thus, there is a need for a Type II diode or optically pumped quantum well (QW) laser having an output wavelength of greater than or equal to about 2.5 microns wherein non-radiative transitions are reduced and higher operating temperatures of, for example, ≧180 degrees Kelvin are achieved.

There is a further need for a Type II quantum-well diode and/or optically pumped laser having an output wavelength of between about 2.5 to about 6.0 microns wherein non-radiative transitions are reduced and higher operating temperatures of, for example, ≧280 degrees Kelvin are achieved.

There is an even further need for a Type II quantum-well diode and/or optically pumped laser having an output wavelength of greater than or equal to about 3.0 microns wherein the gain is increased, for example, to $\geq 500$ cm$^{-1}$ with a pump current of about 70 A/cm$^2$–100 A/cm$^2$ and higher operating temperatures achieved.

There is yet a need for a Type II quantum-well diode and/or optically pumped laser having an output wavelength of greater than or equal to about 3.0 microns wherein the electron dispersion is mainly confined to a two-dimensional density of states wherein the gain achieved (e.g. gain of about 500 cm$^{-1}$ at a threshold pump current between about 70 A/cm$^2$–100 A/cm$^2$ at about 300 degrees Kelvin operating temperature) and the operating temperature of the QW laser is improved over that of the Type II laser (e.g. Type II laser of the UIC/Harvard or Hughes design).

SUMMARY OF THE INVENTION

In accordance with the present invention, a Type II QW diode and/or optically pumped laser is fabricated wherein improved gain, operating temperature and an output wavelength of greater than or equal to about 3.0 microns is achieved using the following general structure.

A diode type II quantum well structure comprising:

(a) an active region further comprising one or more periods, said period further comprising:

(i) a barrier layer having a first index of refraction, a first thickness, a top and a bottom face;

(ii) an adjacent first conduction band layer having a second index of refraction, a second thickness, a top and bottom face, said top face of said first conduction layer being in contact with said bottom face of said top barrier layer;

(iii) an adjacent valence band layer having a third index of refraction, a third thickness, a top and bottom face, said top face of said valence band layer being in contact with said bottom face of said first conduction band layer;

(iv) an adjacent second conduction band layer having a fourth index of refraction, a fourth thickness, a top and bottom face, said top face of said second conduction band layer being in contact with said bottom face of said valence band layer;

wherein said active region is bounded by (b) a p-doped optical cladding layer having a fifth index of refraction, a fifth thickness, a top and bottom face, said top face of said p-doped optical cladding layer being in contact with and adjacent to said bottom face of said second conduction layer;

(c) an n-doped optical cladding layer having a sixth index of refraction, a sixth thickness, a top and bottom face, said bottom face of said n-doped optical cladding layer adjacent to and in contact with said top face of said barrier layer;

(d) an n-doped cap layer having a seventh thickness, a top and bottom face, said bottom face of said n-doped cap layer adjacent to and in contact with said top face of said n-doped optical cladding layer;

(e) a p-doped substrate layer having an eighth thickness, a top and bottom face, said top face of said p-doped substrate layer being adjacent to and in contact with said bottom face of said p-doped optical cladding layer;

(f) a first stripe contact adjacent to and in contact with said top face of said n-doped cap layer, said stripe contact connected to a voltage bias source; and (g) a second stripe contact adjacent to and in contact with said bottom face of said substrate layer, said second stripe contact connected to said voltage bias source, said voltage bias providing a threshold current to electrically pump said active region sufficient to produce a laser output at a wavelength of greater than or equal to about 2.5 microns.

Alternatively, a p-doped buffer layer may be inserted between the p-doped optical cladding layer and the p-doped substrate layer. In addition, if an optically pumped laser is used instead of an electrically pumped diode laser, then all the doping in the n-doped optical cladding layer, the p-doped optical cladding layer, the p-doped optional buffer layer and the p-doped substrate layer is omitted. In general, doping from all layers is omitted with the optically pumped laser made according to the present invention. However, it should be noted that trace dopant amounts may be present in all layers of the optically pumped laser made according to the present invention. Further, with the optically pumped laser, the stripe contacts and the voltage bias source become unnecessary and are removed. It is to be noted that with the optically pumped laser made according to the present invention, the pump wavelength is less than the laser output wavelength (i.e. $\lambda_{pump} < \lambda_{out}$). Finally, the n-doped cap layer may also be omitted altogether in conjunction with the optically pumped laser or the cap layer may be left in place without any n-doping.

In the electrically pumped laser according to the present invention, as an alternative, those layers previously referred to as being doped with n-dopants (i.e. layers referred to as n-doped layers) may be doped with p-dopants and those layers previously referred to as being doped with p-dopants (i.e. layers referred to as p-doped layers) may be doped with n-dopants.

Figure 4:
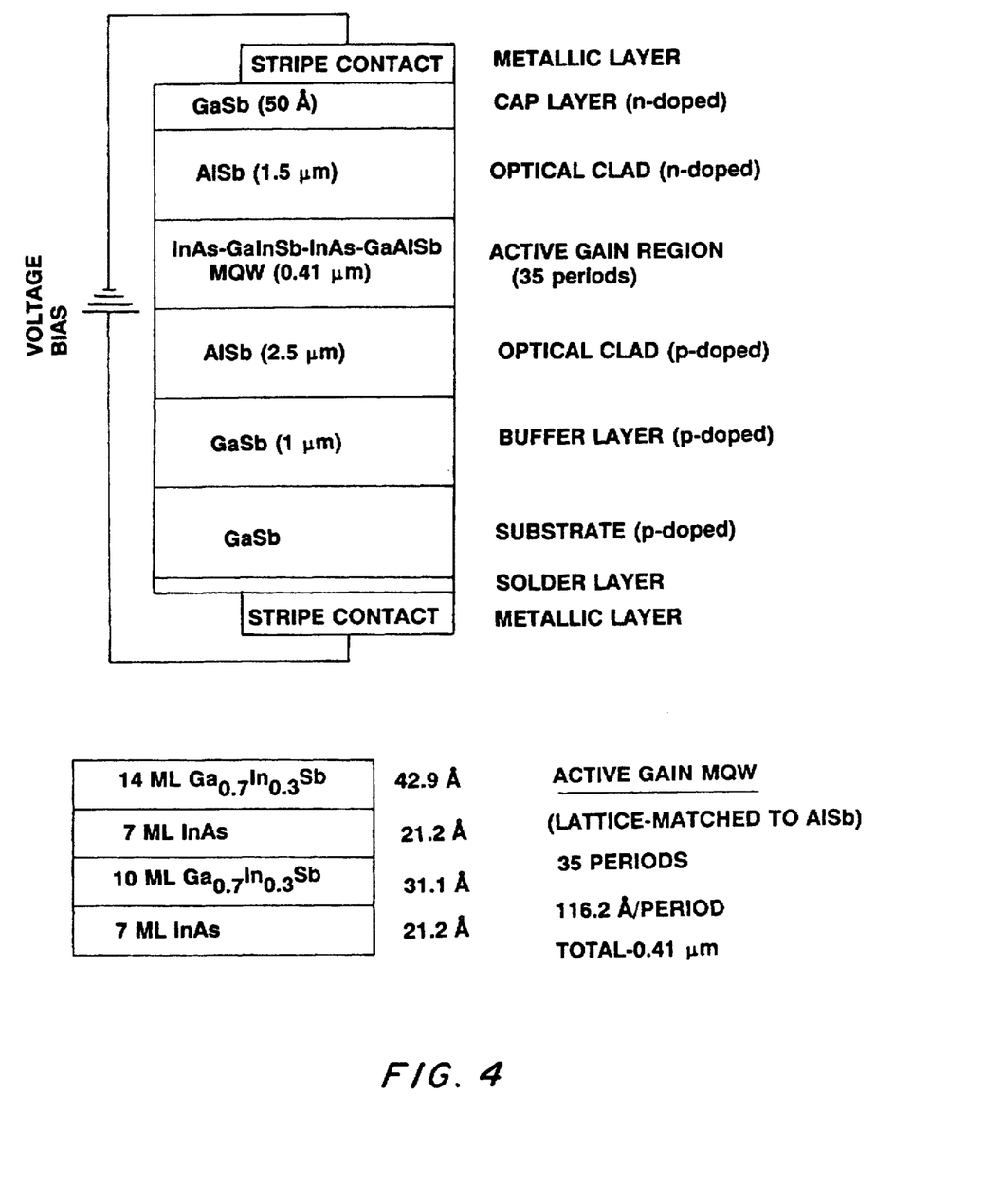

In effect, the dopant types (i.e. n or p) are reversed from that depicted in the exemplary doping scheme of FIG. 4, infra. In addition, the voltage bias contacts are reversed.

Alternative means for providing a thershold pump current for the electrically pumped diode laser made according to the present invention include attaching one contact (i.e. stripe contact) to the doped cap layer and attaching the other contact to either the oppositely doped optical cladding layer, the oppositely doped buffer layer or the oppositely doped substrate layer. For example, if the cap layer is n-doped, then the oppositely doped optical cladding layer, the oppositely doped buffer layer or the oppositely doped substrate layer is p-doped, respectively, and vice versa.

BRIEF DESCRIPTION OF THE DRAWINGS

overlap between the $\psi_n(z)$ (i.e. electron wavefunction) and the $\psi_p(z)$ (i.e. hole wavefunction) is reduced from that in FIG. 1.

FIG. 4 is an exemplary cross-sectional schematic of a laser according to the present invention. Depicted are a plurality of active layers forming the active region, the active region being cladded within an n-doped optical cladding layer and a p-doped optical cladding layer. Exemplary thicknesses of the layers depicted are given. In either the electrically pumped or the optically pumped laser, the active region has a weighted average refractive index less than that of both the n-doped optical cladding layer and the p-doped cladding layer, respectively. The n-doped optical cladding is further coated with an n-doped cap layer. The cap layer being in contact with a stripe contact connected to a voltage bias. In addition, the p-doped cladding layer may optionally be coated with a p-doped buffer layer which buffer layer is further coated with a p-doped substrate layer. The p-doped substrate layer is in contact with another contact in contact with the voltage bias source. Note that the buffer layer is optional with either the electrically pumped laser or the optically pumped laser. In the case of the optically pumped laser, all intentional doping is omitted. Note that trace dopant amounts may be present in one or more of the exemplary layers depicted in FIG. 4. Further, the cap layer may be optionally omitted in the case of the optically pumped laser made according to the present invention as long as the laser is protectively coated or the top cladding layer is stable in air.

DETAILED DESCRIPTION OF THE PREFERRED EMBODIMENTS

The following detailed description of the invention is provided to aid those skilled in the art in practicing the present invention. However, the following detailed description of the invention should not be construed to unduly limit the present invention. Variations and modifications in the embodiments discussed may be made by those of ordinary skill in the art without departing from the scope of the present inventive discovery.

Figure 3:
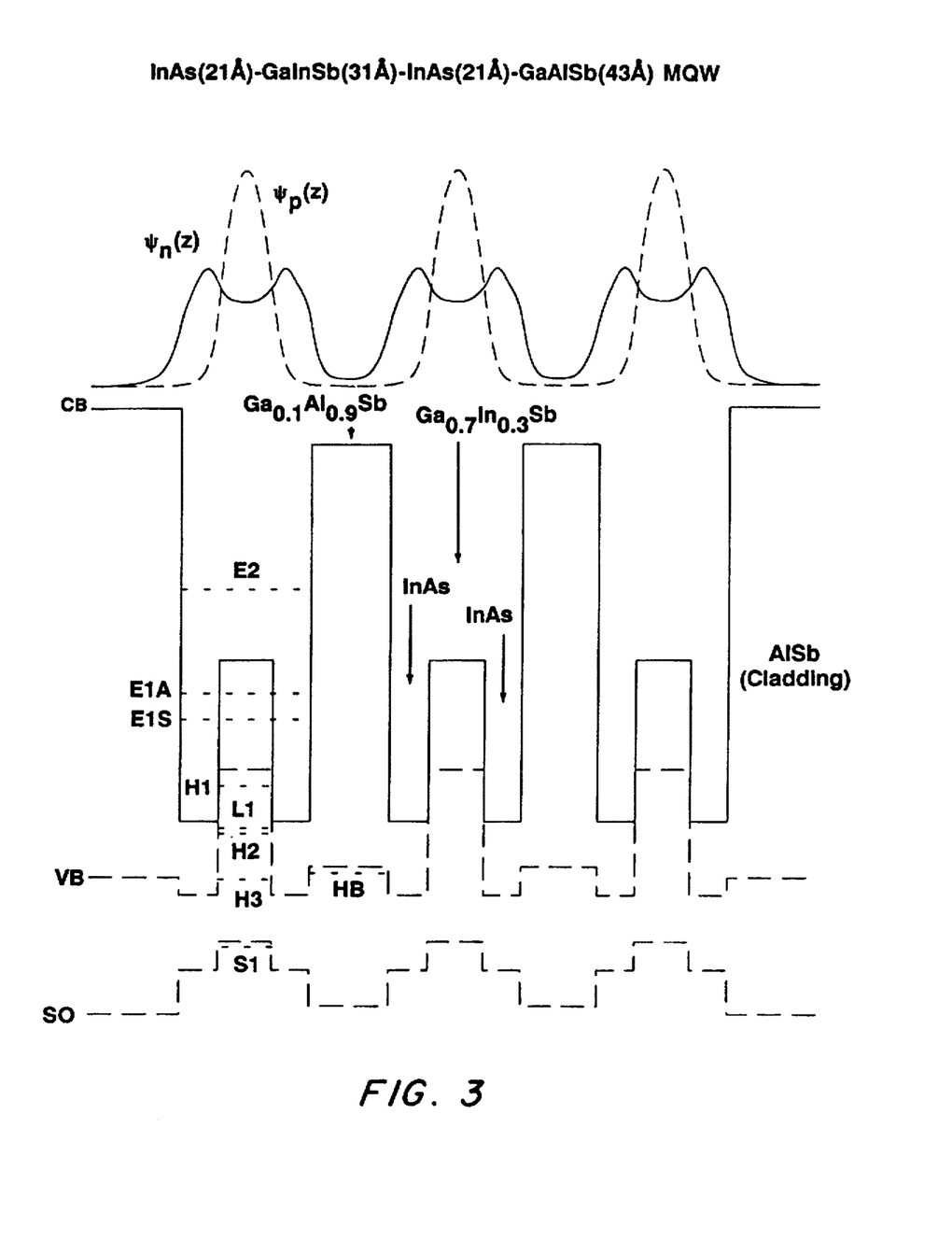
FIG. 3 depicts band profiles and FEM wavefunctions and energy levels for an exemplary Type II InAs-Ga$_{0.70}$In$_{0.30}$Sb-InAs-Ga$_{0.1}$Al$_{0.9}$Sb four-constituent quantum well which is lattice matched to the AlSb cladding layers. This exemplary structure combines both the 2-dimensional electron disperson of FIG. 2 and the large wavefunction overlap of FIG. 1.

In reference to FIG. 3, it should be noted that the energy gap $E_g$ is typically the energy difference between the energy level E1S and the energy level H1. To minimize Auger recombination and to increase gain, a laser structure is sought wherein $E_g$ does not equal (i.e. does not resonate) with any non-radiative transitions. Typically, this is accomplised by achieving the following:

$E_g \neq$ intervalence splitting between Hi and any lower valence sub-band    (1)

$E_g \neq \Delta_o$    (2)

wherein $\Delta_o$ is the energy level difference between H1 and S1. See FIG. 3. Typically, condition (2) is achieved if $E_g < \Delta_o$.    (3)

Valence sub-band energy levels in a valence quantum well are approximately given by the following:

$E_j = (j^2 \pi^2 h^2)/2m^* d_w^2$    (4)

wherein j is the sub-band index, h is Planck's constant, m* is the effective mass (m*=m$_h$ for heavy holes and m*=m$_l$ for light holes) and d$_w$ is the thickness of the valence band layer. Using equation (4) one can design a multiple quantum well according to FIGS. 3 and 4 to obtain a value of $E_g$ wherein conditions (1) and (2) are met. In addition, condition (3) may also be met by choosing the proper thickness of the valence band layer.

In addition, if the valence band layer is sufficiently thin, then E1A–E1S>kT, wherein E1S denotes the ground state symmetic conduction subband level and E1A denotes the ground state antisymmetric conduction subband level. For example, see FIG. 3 wherein the E1 enegy level has split into the E1S and E1A energy levels within the exemplary conduction band layers of InAs and wherein E1S is the lower energy level with respect to the E1A energy level.

The thickness of the valence band layer should also be sufficient to satisfy the conditions that:

$$E_g \neq E1A - E1S. \quad (5)$$

Typically, condition (5) is met when either of the following conditions are also met:

$$E_g > E1A - E1S, \quad (6)$$

and preferably when $$E1A - E1S > kT, \quad (7)$$

or more preferably when $$E1A - E1S > 2kT, \quad (8)$$

or most preferably when $$E1A - E1S > 4kT \quad (9)$$

wherein k is Boltzmann's constant and T is the laser operating temperature in degrees Kelvin. As the valence band thickness is reduced, then conditions (6) and ((7) and/or (8) and/or (9)) are more readily met within the conduction band layer. As the difference between the E1A and the E1S becomes larger upon using a thinner and thinner valence band layer, then most of the electrons lie in the E1S level of the conduction band. Likewise, as the difference between E1A and E1S gets larger, by using thinner and thinner valence band layers, so do all the other energy differences denoted by En–E1S, (n denoting a given energy level within the conduction band layer) become larger and larger. Thus, the relative lower energy of E1S with respect to E1A favors the condition that most of the electrons in the conduction band layer are at the E1S energy level. The electrons within the conduction band at the E1S level upon a transition to the H1 level of the valence band layer cause a desired laser output. In other words, an electron transition from the E1S (conduction band electron) energy level to the H1 (valence band hole) level results in a desired output of a photon having the energy equal to the energy difference between E1S and H1, such that E1S–H1=hν wherein ν=c/λ, h is Planck's constant, λ is the output wavelength of the laser and c denotes the speed of light.

However, if a too thin valence band layer is used then interface roughness is encountered which broadens out of the valence energy levels, especially the H1 valence band energy level, and causes a decrease in the gain of the laser output. Thus, the valence band layer should not be so thin so as to result in severe interface roughness (i.e. severe interface roughness—said interface roughness being sufficient to broaden out the valence band energy levels, especially the H1 level, causing a decrease of 33% or more in the gain of the laser).

A more precise method for determininig all of the energy levels of the laser made according to FIGS. 3 and 4 to more accurately meet conditions (1), (2), (3), (5), (6), (7), (8) and/or (9), the multiband energy levels can be calculated using finite element modeling (FEM). See L. R. Ram-Mohan et al., Multiband Finite Element Modeling of Wavefunction-Engineered Electro-Optical Devices, Journal of Nonlinear Optical Physics and Materials, Vol. 4, No. 1, pp. 191–243, (1995), incorporated herein by reference in its entirety and for all purposes.

Typically, the stripe contact (i.e. or contact) is made of an metallic material capable of carrying the threshold current to the optional cap layer or the optical cladding layer and further carrying current back from the substrate layer to the voltage bias. Typically, the stripe contact may be made from, for example, Au/Te, or other commonly used metals used as a stripe contact material for diode lasers.

The n-doped cap layer in a diode laser according to the present invention may be made of materials such as GaSb, $Ga_{1-x}Al_xSb$ ($0 \leq x \leq 0.7$), or InAs. Typically, the thickness of the cap layer in the optically pumped laser may be between about 0–1000 Å. More typically, the thickness of the cap layer in the diode laser may be between about 20–300 Å. Most typically, the thickness of the cap layer in the diode laser may be between about 30–200 Å. Preferably, the thickness of the cap layer in the diode laser may be between about 40–100 Å. More preferably, the thickness of the cap layer in the diode laser may be between about 45–75 Å. Most preferably, the thickness of the cap layer in the diode laser may be between about 49–50 Å.

In the case of the diode laser, the cap layer is typically n-doped. Typically, the n-dopant is an element such as Te, Se, Si, or mixtures thereof. Preferred n-dopants for GaSb or $Ga_{1-x}Al_xSb$ are Te and Se. If the cap layer is made of InAs, then the preferred n-dopant is Si.

The typical concentration of the n-dopant(s) in the cap layer of the diode laser is between about $10^{17}$/cc to about $10^{19}$/cc. More typically, the concentration of the n-dopant(s) is about $10^{18}$/cc.

If an optically pumped laser is used instead of an electrically pumped diode laser, then no doping in the cap layer is used. In additioin, in the case of the optically pumped laser, the cap layer may be omitted altogether as long as the top layer (e.g. optical cladding layer) of the laser is protectively coated or the top cladding layer is stable under ambient conditions.

Generally, when an optically pumped laser is used, no intentional dopants are typically used in any of the layers making up the multiple quantum well type II laser made according to the present invention (e.g. see FIGS. 3 and 4).

Note also that the optical cladding layers are lattice matched to the active region. In addition, in the electrically pumped laser according to the present invention, as an alternative, those layers previously referred to as being doped with n-dopants (i.e. layers referred to as n-doped layers) may be doped with p-dopants and those layers previously referred to as being doped with p-dopants (i.e. layers referred to as p-doped layers) may be doped with n-dopants.

In effect, the dopant types (i.e. n or p) are reversed from that depicted in the exemplary doping scheme of FIG. 4, supra. However, the respective concentrations of p-dopants and n-dopants, given, infra, remain unchanged. In addition, the voltage bias contacts are reversed. Typically, the n-dopants and p-dopants are incorporated into the respective layers as the respective layers are grown by, for example, molecular beam epitaxy or by metallorganic chemical vapor deposition or other growth techniques well known in the art. In addition, the active region is lattice matched to both the optical cladding layers and/or the substrate layer.

For an electrically pumped laser according to the present invention, the n-doped optical cladding layer is made of a material such as AlSb, $Al_{1-y}Ga_ySb$ ($0 \leq y \leq 0.5$), $AlSb_{1-z}As_z$ ($0 \leq x \leq 0.5$), $AlSb_{1-a}P_a$ ($0 \leq a \leq 0.5$), AlGaInSb, AlGaAsSb, an InAs/AlSb superlattice, or mixtures thereof. For an electrically pumped laser according to the present invention, the p-doped optical cladding layer is made of a material such as AlSb, $Al_{1-y}Ga_ySb$ ($0 \leq y \leq 0.5$), $AlSb_{1-z}-As_z$ ($0 \leq x \leq 0.5$), $AlSb_{1-a}P_a$ ($0 \leq a \leq 0.5$), AlGaInSb, AlGaAsSb, an InAs/AlSb superlattice, or mixtures thereof. For the case of the InAs/AlSb superlattice, the AlSb barrier layer must be thin enough that electrons may conduct along the growth axix. Note that the n-doped optical cladding layer may be made from a material the same or different from the material of the p-doped cladding layer.

Typically, the n-doped cladding layer has a thickness of between about 0.5–5 micrometers. More typically, the n-doped cladding layer has a thickness of between about 1.0–4 micrometers. Most typically, the n-doped cladding layer has a thickness of between about 1.5–3 micrometers.

Typically, the n dopants of the n-doped optical cladding layer are Te, Se, Si or mixtures thereof. Te and Se are preferred n-dopants for AlSb based claddings. Si is the preferred n-dopant for the InAs/AlSb superlattice optical claddings where the dopant is incorporated into the InAs layers. The concentration of the n-dopants in the n-doped optical cladding layer is, typically, between about $5 \times 10^{16}$/cc–$10^{19}$/cc. The concentration of the n-dopants in the n-doped optical cladding layer is, more typically, between about $2 \times 10^{17}$/cc–$10^{18}$/cc.

Typically, the p-doped cladding layer has a thickness of between about 1–5 micrometers. More typically, the p-doped cladding layer has a thickness of between about 1.5–4 micrometers. Most typically, the p-doped cladding layer has a thickness of between about 2–3 micrometers. Preferably, the p-doped cladding layer has a thickness of between about 2.5–3 micrometers.

Typically, the p-dopants of the p-doped optical cladding layer are Be, Zn, Si or mixtures thereof. Be is the preferred p-dopant. The concentration of the p-dopants in the p-doped optical cladding layer is, typically, between about $5 \times 10^{16}$/cc–$10^{19}$/cc. The concentration of the p-dopants in the p-doped optical cladding layer is, more typically, between about $2 \times 10^{17}$/cc–$10^{18}$/cc.

The index of refraction of both the n-doped and the p-doped optical cladding layers is lower than the average weighted refractive index of the active region. Typically, the refractive index of the n-doped and the p-doped optical cladding layers is between about 2.8–3.35. The index of refraction of both the n-doped and the p-doped optical cladding layers is greater than the average weighted refractive index of the active region by at least about 0.1.

The active region of the laser is made of one or more periods (i.e. active layers) comprised of a barrier layer, a first conduction band layer, a valence band layer, and a second conduction band layer. Taken together, a barrier layer adjacent to and in contact with the first conduction band layer in turn adjacent to and in contact with the valence band layer in turn adjacent to and in contact with the second conduction band layer forms a period of the active region. Typically, there are 1–100 periods in the active region. More typically, there are 5–50 periods in the active region. Most typically, there are 10–40 periods in the active region. Preferably, there are 10–35 periods in the active region. More preferably, there are 10–20 periods in the active region.

The typical average weighted refractive index of each period is between about 3.25–3.80 (i.e. the refractive index of the barrier layer is multiplied by its thickness; the refractive index of the first conduction band layer is multiplied by its thickness; the refractive index of the valence band layer is multiplied by its thickness; the refractive index of the second conduction band layer is multiplied by its thickness; all the numbers so multiplied are added and divided by the total thickness of each period to obtain the average weighted refractive index of the active region). Note that the average weighted refractive index of the active region is at least 0.1 greater than the refractive index of the optical cladding layers.

The barrier layer within each period of the active region may be made from materials such as $Ga_{1-b}Al_bSb$ ($0.3 \leq b \leq 1.0$), AlSb, $AlSb_{1-c}As_c$ ($0 \leq c \leq 0.5$), $AlSb_{1-d}P_d$ ($0 \leq d \leq 0.5$), $Al_{1-e}In_eSb$ ($0 \leq e \leq 0.5$), AlGaInSb, AlGaAsSb and $InSb_{1-u}P_u$ ($0.2 \leq u \leq 0.8$). Examples of $Ga_{1-b}Al_bSb$, AlSb include $Ga_{0.1}Al_{0.9}Sb$ and $Ga_{0.88}Al_{0.12}Sb$. The preferred barrier layer material is AlSb or $Al_{1-s}(Ga_{1-q}In_q)_sSb$ where ($0 \leq q \leq 0.6$) and ($0 \leq s \leq 0.8$) wherein $(Ga_{1-q}In_q)_sSb$ is more preferred as the barrier layer material if $(Ga_{1-q}In_q)_sSb$ is present in the valence layer. Most preferably, the barrier layer is undoped. However, the barrier layer may be p-doped, for example, with Be, Si, Zn or mixtures thereof. The concentration of the dopants in the barrier layer is typically between about $5 \times 10^{15}$/cc–$2 \times 10^{18}$/cc. Typically, the thickness of the barrier layer is between about 15–200 Å. More typically, the thickness of the barrier layer is between about 30–150 Å. Most typically, the thickness of the barrier layer is between about 32–100 Å. Preferably, the thickness of the barrier layer is between about 35–60 Å.

The first conduction band layer within each period of the active region may be made from materials such as InAs, $InAs_{1-f}Sb_f$ ($0 \leq f \leq 0.5$), $InAs_{1-g}P_g$ ($0 \leq g \leq 0.5$), $In_{1-h}Al_hAs$ ($0 \leq h \leq 0.5$), $In_{1-i}Ga_iAs$ ($0 \leq i \leq 0.5$), and InAlAsSb. The second conduction band layer within each period of the active region may be made from materials such as InAs, $InAs_{1-f}Sb_f$ ($0 \leq f \leq 0.5$), $InAs_{1-g}P_g$ ($0 \leq g \leq 0.5$), $In_{1-h}Al_hAs$ ($0 \leq h \leq 0.5$), $In_{1-i}Ga_iAs$ ($0 \leq i \leq 0.5$), and InAlAsSb. Preferably, both the first and second conduction band layers are made from the same material; however, they may be the same or different. Preferably, there are no dopants in either the first or the second conduction band layer within each period of the active region.

Typically, the thickness of the first and the second conduction band layers within each period of the active region is between about 10–60 Å. More typically, the thickness of the first and the second conduction band layers within each period of the active region is between about 11–45 Å. Most typically, the thickness of the first and the second conduction band layers within each period of the active region is between about 12–40 Å. Preferably, the thickness of the first and the second conduction band layers within each period of the active region is between about 15–25 Å. Generally, the thickness of the first and second conduction band layers within each period governs the output wavelength of the laser made according to the present invention and the thickness must be larger for longer wavelength outputs and vice versa. The thickness of the first conduction band layer may be the same or different from the thickness of the second conduction band layer. However, it is preferred that the thicknesses and the material from which the first and second conduction band layers are made be the same.

The valence band layer within each period of the active region is made from materials such as $Ga_{1-q}In_qSb$ ($0 \leq q \leq 0.6$), GaSb, GaInSbAs, and GaInAlSb. Typically, the thickness of the valence band layer is between about 15–70 Å. More typically, the thickness of the valence band layer is between about 16–60 Å. Most typically, the thickness of the valence band layer is between about 17–50 Å. Preferably, the thickness of the valence band layer is between about 18–45 Å. More preferably, the thickness of the valence band layer is between about 20–40 Å.

As exemplarily depicted in FIG. 3, the cap layer is adjacent to and in contact with the n-doped optical cladding layer which in turn is adjacent to and in contact with the active region comprised of one or more periods. The active region in turn is adjacent to and in contact with the p-doped optical cladding layer which in turn is adjacent to and in contact with the optional p-doped buffer layer. The optional p-doped buffer layer (i.e. the buffer layer is optional in the case of either the optically pumped laser or the electrically pumped laser made according to the present invention) is adjacent to and in contact with the substrate layer.

Figure 10:
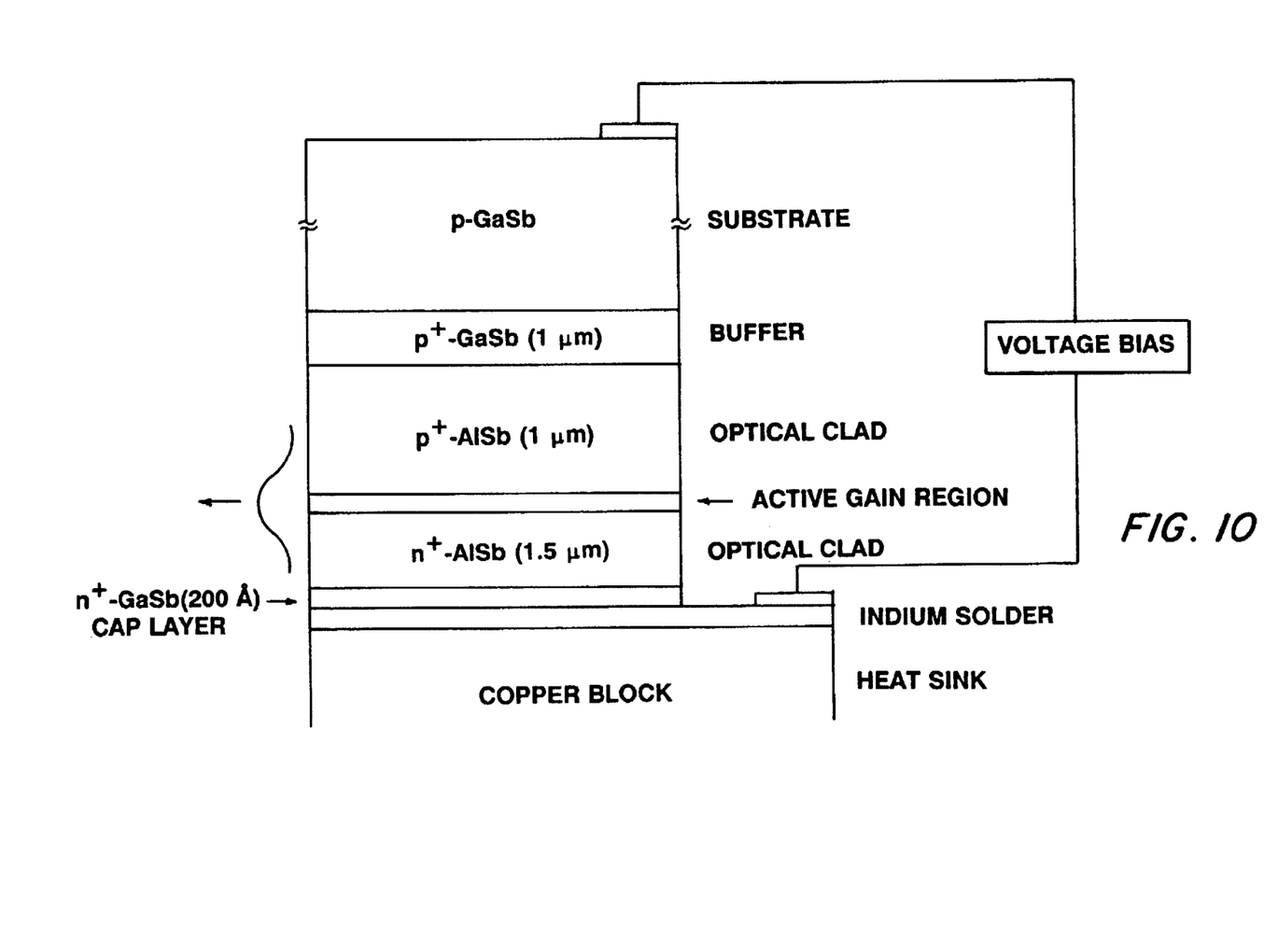
FIG. 10 is a schematic of an exemplary diode laser attached to a heat sink such as copper via an exemplary indium solder.

In the case of the electrically pumped laser made according to the present invention in one preferred embodiment, a first stripe contact is adjacent to and in contact with the n-doped cap layer and a second stripe contact is adjacent to and in contact with the p-doped substrate layer. As exemplarily depicted in FIG. 10, the n-doped cap layer is further adjacent to and in contact to a solder layer (e.g. indium solder layer) which in turn is adjacent to and in contact with a heat sink (e.g. copper block). Each of the two first and second stripe contacts are attached to a voltage bias source. The voltage bias source provides the electrical pumping (i.e. threshold current) necessary to cause the laser made according to the present invention to lase at a wavelength of at least about 2.5 micrometers.

The optional buffer layer may be made from a material such as GaSb, $Al_{1-v}As_vSb$ ($0 \leq v \leq 0.5$), AlSb, $Ga_{1-r}Al_rSb$ ($0 \leq r \leq 1$), and InAs. The buffer layer may be p-doped with Be, Si, Zn or mixtures thereof. Dopants are preferred in the electrically pumped laser. Dopants are not preferred in the optically pumped lasers. The p-dopants in the buffer layer, typically, have a concentration between about $5 \times 10^{16}$/cc–$10^{19}$/cc. The p-dopants in the buffer layer, more typically, have a concentration between about $2 \times 10^{17}$/cc–$10^{18}$/cc. Typically, the thickness of the buffer layer is between about 0–2 micrometers. More typically, the thickness of the buffer layer is between about 0–1 micrometers. Most typically, the thickness of the buffer layer is between about 0.1–1 micrometers.

The substrate layer may be made from a material such as GaSb, InAs, InP, GaAs or other IIIA-VA termary materials. A variety of p-dopants may be present in the substrate layer. Generally, dopants are preferred in the electrically pumped laser. Dopants are not preferred in the optically pumped lasers. However, trace dopant amounts may be present in the optically pumped laser. The p-dopants in the substrate layer, typically, have a concentration between about $5 \times 10^{16}$/cc–$10^{19}$/cc. The p-dopants in the substrate buffer layer, more typically, have a concentration between about $2 \times 10^{17}$/cc–$10^{18}$/cc. Typically, the substrate layer is made from a material that may be the same or different from that of the buffer layer.

EXAMPLES

Example 1

An experimental investigation of an optically pumped InAs-$Ga_{0.7}In_{0.03}$Sb-InAs-AlSb (21 Å–31 Å 21 Å–43 Å) multiple quantum well (MQW)laser was carried out. The AlSb layer was the barrier layer. The InAs layers were the conduction band layers and the $Ga_{0.7}In_{0.3}$Sb layer was the valence band layer. The laser emitted at 3.8–4.2 micrometers. The design of the Type II structure with four constituents in each period was chosen to maximize the wavefunction overlap and minimize Auger recombination, while assuring that both electrons and holes have 2 dimensional density of states with no dispersion along the growth axis. The undoped MQWs were grown in a Riber 32 molecular beam epitaxy (MBE) system on a rotating GaSb substrate. Growth rates for each layer composition were calibrated to within ±2% using reflection hgh-energy electron diffraction (RH-EED) on test samples. A GaSb buffer layer adjacent to the substrate and the 1.5 micrometer thick top and bottom AlSb optical cladding layers were grown at 510° C., while the MQW active region ws grown at 440° C. The MQW had 35 periods for a total thickness of 0.41 micrometers, and had a lattice constant matched to that of the (relaxed) AlSb bottom cladding layer.

During growth, the $Ga_{0.7}In_{0.3}$Sb layers in the active region (i.e. the valence band layer in this example) and the AlSb cladding layers displayed 1×3 RHEED patterns while the InAs layer exhibited 1×2 patterns with a V/III beam-equivalent ratio of 10. The RHEED patterns for the AlSb barriers in the MQW were not as good, however, probably because the active-region growth temperature was lower than the optimal value for that material.

Broad area lasers were lapped and polished to a thickness of 125 micrometers, and then cleaved to cavity lengths of 500 micrometers. The laser bars were indium heat sunk to a copper cold finger, epitaxial-side-up, and mounted in an Air Products Heli-Tran dewar. The samples were optically pumped by 10 ns pulses from a Q-switched 1.06 micrometer Nd:YAG laser operating at 10 Hz or pumped by 70 ns pulses from a Q-switched 2.06 micrometer Ho:YAG laser operating at 1 Hz. The mid-IR output was collected and focused onto the slit of a ¼ meter monochromator and InSb detector. At 87K, the photoluminesence spectrum obtained for surface emission from a 1 $cm^2$ sample exhibited a peak at 4.17 micrometers (297 meV) and a full width at half-maximum of 70 meV. The peak wavelength displays a red-shift, from 3.86 micrometers at 81K to 4.06 micrometers at 240K, which reflected the temperature shift of the energy gap.

Figure 7:
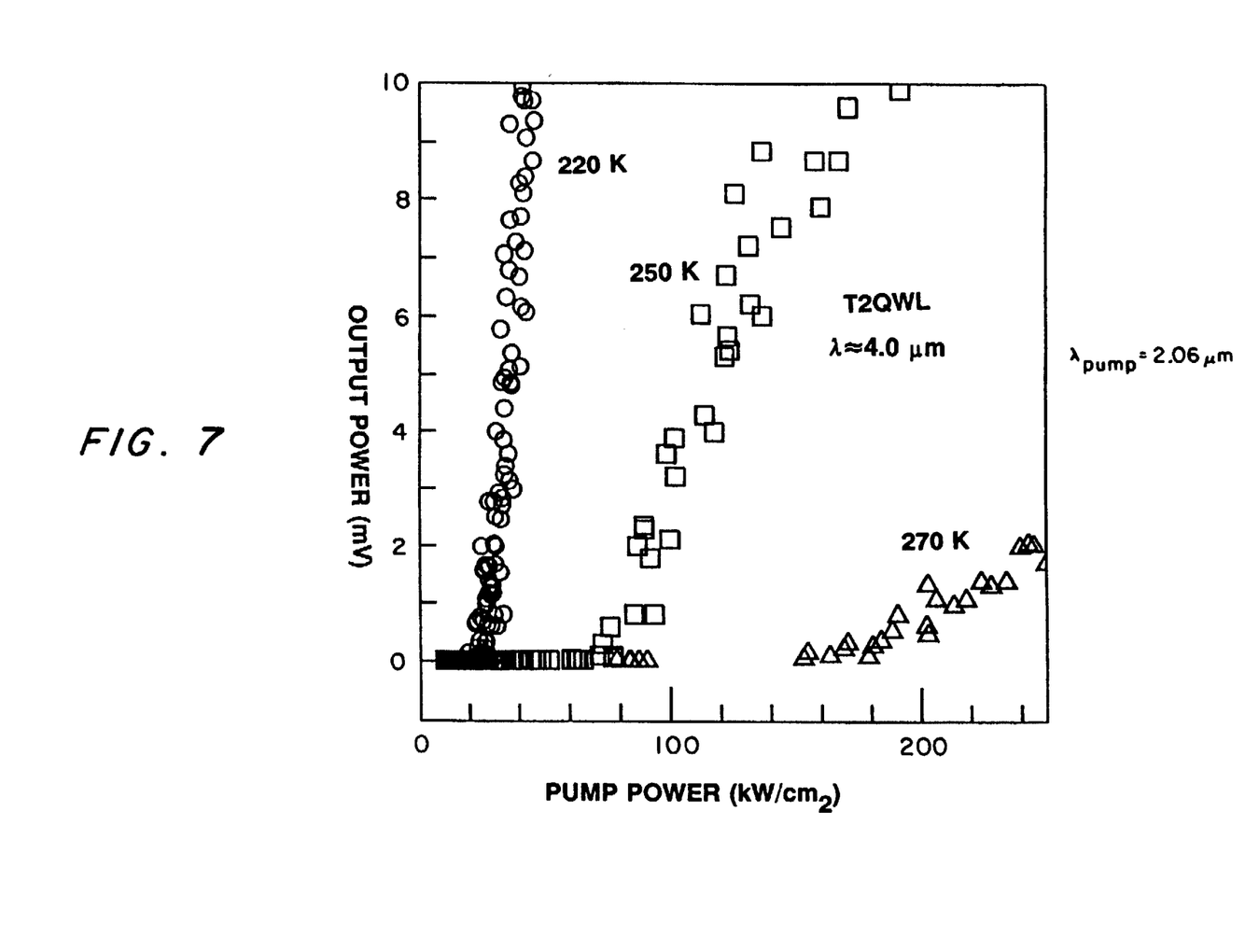
FIG. 7 is a plot of experimental output power versus pump power for the optically pumped multiple quantum well according to FIGS. 3 and 4 at various operating temperatures of 220, 250 and 270 degrees Kelvin, respectively, with a laser output at 4.1 micrometers. Note that the pump wavelength was at about 2.06 micrometers. Further note that no doping is utilized for the optically pumped laser according to the present invention.
Figure 8:
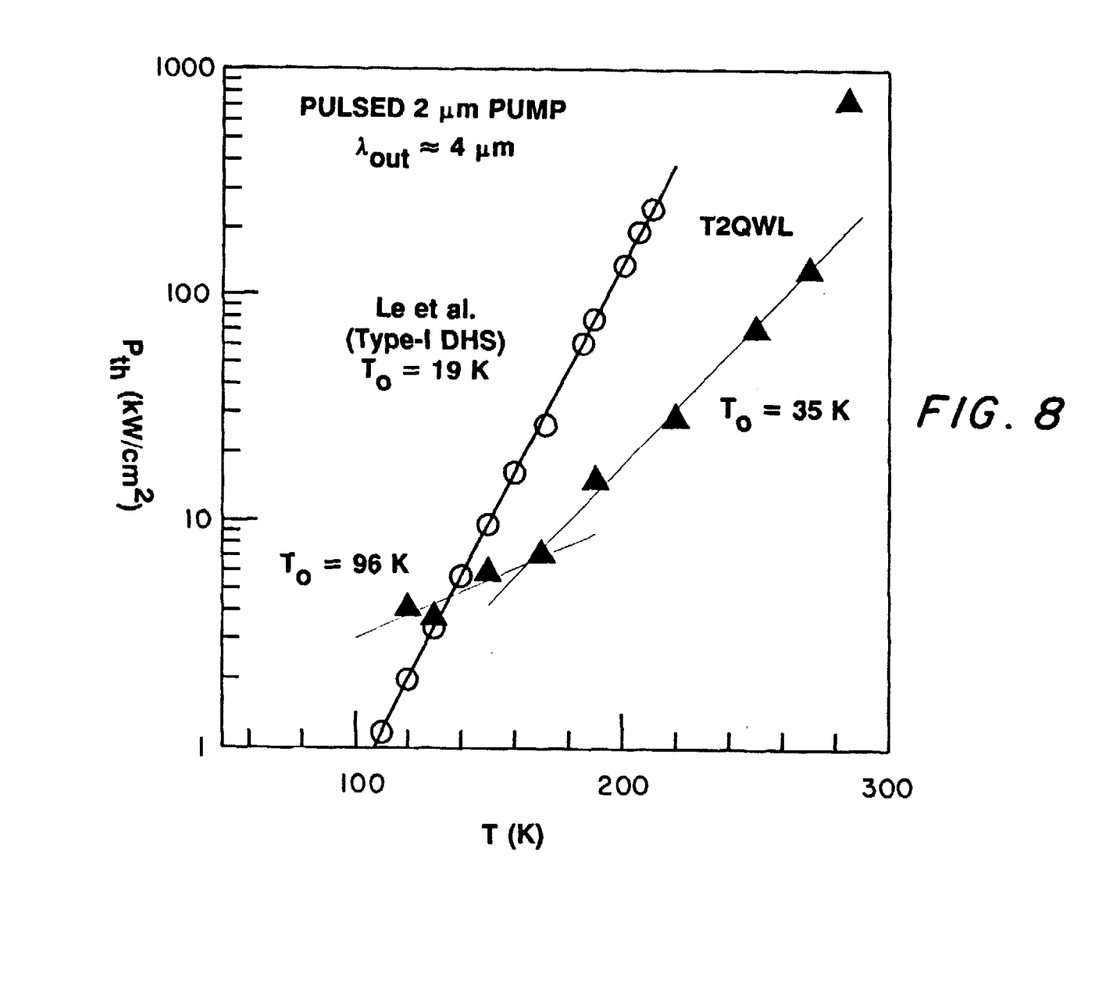
FIG. 8 is a plot of experimental threshold power versus temperature for an optically pumped multiple quantum well laser according to FIGS. 3 and 4 (optically pulsed pumping at about 2 micrometers) for a laser output at about 4 micrometers. Experimental results (i.e. solid triangles) are compared to the best results available from the literature (i.e. open circles). See Le et al., High-efficiency, high-temperature mid-infrared ($\lambda \geq 4$ μm) InAsSb/GaSb lasers, ELECTRONICS LETTERS, Vol. 30, No. 23, pp. 1944-45 (Nov. 10, 1994), incorporated herein by reference in its entirety and for all purposes.
Figure 9:
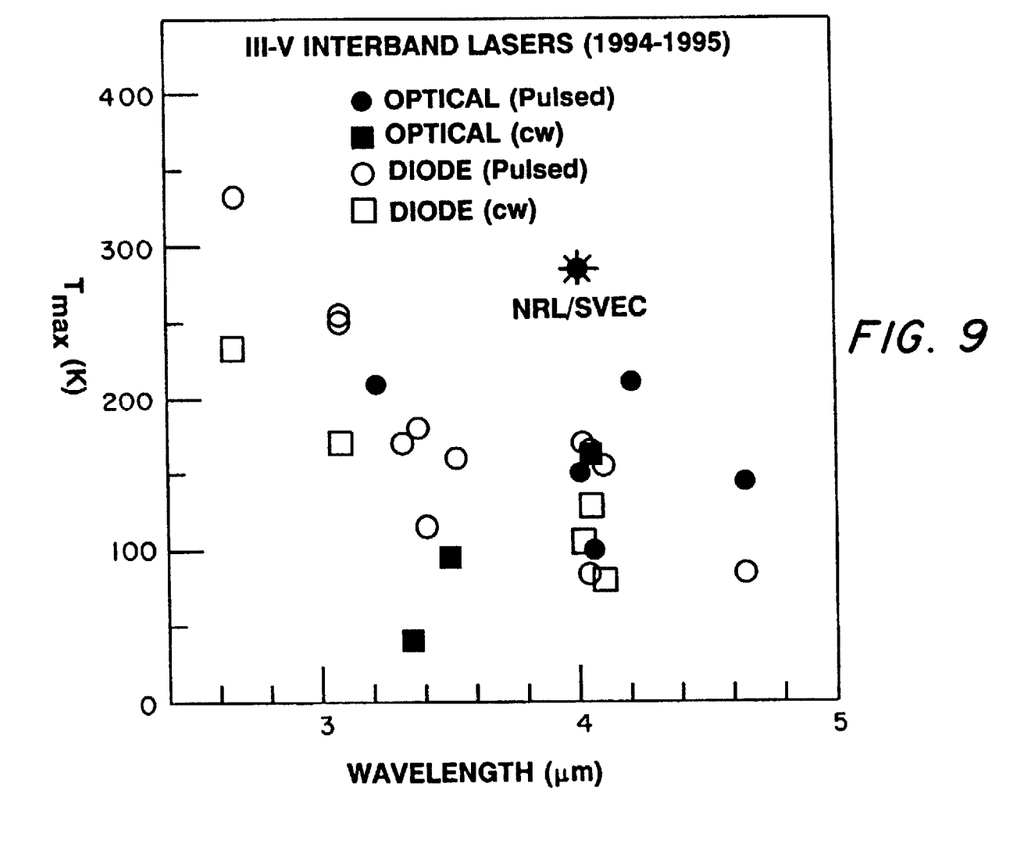
FIG. 9 is a plot of experimental maximum operating temperature versus output wavelength for both the electrically pumped (continuous—CW and pulsed) and the optically pumped laser (continuous—CW and pulsed), the data points of open and solid circles and open and solid squares being obtained from the literature. For comparison, the data point indicated by the asterisk is obtained from an optically pumped multiple quantum well Type II laser of the present invention made according to Example 1, infra. Note that for the optically pumped (i.e. pulsed optical pumping) laser made according to Example 1, infra, a laser output at about 4 micrometers is achieved at nearly 300 degrees Kelvin.

The maximum peak output at 81K was ≈650 mW (at 170K, 200 mW was collected. FIG. 7 illustrates the output power as a function of input power showing threshold behavior at T=220K, 250K adn 270K (degrees Kelvin). FIG. 8 shows the thershold power as a function of operating temperature for the laser of the present example (made according to the present invention)—filled triangles as compared to the values found in the article of Le et al., supra,—open circles. The maximum lasing temperature of of 285K for the present invention exceeds any previous value for $\lambda_{output}>3$ micrometers by over 70K. The characteristic temperature, $T_o$=96K, at $T \leq 170K$ and $T_o$=35K at $170K \leq T \leq 270K$ are also higher than previously obtained results for $\lambda_{output} \geq 3$ (note T is the operating temperature). FIG. 9 compares the maximum operating temperature for the laser made according to the present example (the data point for the present example is denoted by an asterisk) with other data from literature as a function of wavelength.

We claim:

1. An electrically pumped type II quantum well laser structure comprising:
   (a) an active region further comprising one or more periods, said period further comprising:
      (i) a barrier layer having a first index of refraction, a first thickness, a top and a bottom face;
      (ii) an adjacent first conduction band layer having a second index of refraction, a second thickness, a top and bottom face, said top face of said first conduction layer being in contact with said bottom face of said top barrier layer;
      (iii) an adjacent valence band layer having a third index of refraction, a third thickness, a top and bottom face, said top face of said valence band layer being in contact with said bottom face of said first conduction band layer;
      (iv) an adjacent second conduction band layer having a fourth index of refraction, a fourth thickness, a top and bottom face, said top face of said second conduction band layer being in contact with said bottom face of said valence band layer wherein said barrier layer and said valence band layer are of different materials;

wherein said active region is bounded by (b) a p-doped optical cladding layer having a fifth index of refraction, a fifth thickness, a top and bottom face, said top face of said p-doped optical cladding layer being in contact with and adjacent to said bottom face of said second conduction layer;

(c) an n-doped optical cladding layer having a sixth index of refraction, a sixth thickness, a top and bottom face, said bottom face of said n-doped optical cladding layer adjacent to and in contact with said top face of said barrier layer;

(d) an n-doped cap layer having a seventh thickness, a top and bottom face, said bottom face of said n-doped cap layer adjacent to and in contact with said top face of said n-doped optical cladding layer;

(e) a p-doped substrate layer having an eighth thickness, a top and bottom face, said top face of said p-doped substrate layer being adjacent to and in contact with said bottom face of said p-doped optical cladding layer; and (f) a means for providing a threshold current to electrically pump said active region sufficient to produce a laser output at a wavelength of greater than or equal to about 2.5 microns.

2. The laser of claim 1 wherein said means for providing said threshold current fruther comprises:

(a) a first stripe contact adjacent to and in contact with said top face of said n-doped cap layer, said stripe contact connected to a voltage bias source; and (b) a second stripe contact adjacent to and in contact with said bottom face of said substrate layer, said second stripe contact connected to said voltage bias source.

3. The laser of claim 1 wherein each of said fifth index of refraction and said sixth index of refraction are smaller by at least 0.1 than a weighted average of said first, said second, said third and said fourth indices of refraction.

4. The laser of claim 3 wherein (a) said barrier layer is made from a material selected from the group consisting of $Ga_{1-b}Al_bSb$ wherein $0.323 \leq b \leq 1.0$, AlSb, $AlSb_{1-c}As_c$ wherein $0 \leq c \leq 0.5$, $AlSb_{1-d}P_d$ wherein $0 \leq d \leq 0.5$, $Al_{1-e}In_eSb$ wherein $0 \leq e \leq 0.5$, AlGaInSb, AlGaAsSb and $InSb_{1-u}P_u$ wherein $0.2 \leq u \leq 0.8$;

(b) said cap layer is made from a material selected from the group consisting of GaSb, $Ga_{1-x}Al_xSb$ wherein $0 \leq x \leq 0.7$, and InAs;

(c) each of said n-doped and said p-doped optical cladding layers are made from a material selected from the group consisting of AlSb, $Al_{1-y}Ga_ySb$ wherein $0 \leq y \leq 0.5$, $AlSb_{1-z}As_z$ wherein $0 \leq x \leq 0.5$, $AlSb_{1-a}P_a$ wherein $0 \leq a \leq 0.5$, AlGaInSb, AlGaAsSb, and an InAs/AlSb superlattice;

(d) each of said first and second conduction band layers are made from a material selected from the group consisting of InAs, $InAs_{1-f}Sb_f$ wherein $0 \leq f \leq 0.5$, $InAs_{1-g}P_g$ wherein $0 \leq g \leq 0.5$, $In_{1-h}Al_hAs$ whrein $0 \leq h \leq 0.5$, $In_{1-i}Ga_iAs$ wherein $0 \leq i \leq 0.5$, and InAlAsSb;

(e) said valence band layer is made from a material selected from the group consisting of $Ga_{1-q}In_qSb$ wherein $0 \leq q \leq 0.6$, GaSb, GaInSbAs, and GaInAlSb;

(f) said substrate layer is made from a material selected from the group conssiting of GaSb, InAs, InP, and GaAs; and (g) each of said first and second stripe contacts are metallic.

5. The laser of claim 4 wherein (a) said cap layer is doped with n-dopants selected from the group consisting of Te, Se, Si and mixtures thereof;

(b) said n-doped cladding layer is doped with n-dopants selected from the group consisting of Te, Se, Si and mixtures thereof; and (c) said p-doped cladding layer is doped with p-dopants selected from the group consisting of Be, Zn, Si and mixtures thereof.

6. An optically pumped type II quantum well laser structure comprising:

(a) an active region further comprising one or more periods, said period further comprising:

(i) a barrier layer having a first index of refraction, a first thickness, a top and a bottom face;

(ii) an adjacent first conduction band layer having a second index of refraction, a second thickness, a top and bottom face, said top face of said first conduction layer being in contact with said bottom face of said top barrier layer;

(iii) an adjacent valence band layer having a third index of refraction, a third thickness, a top and bottom face, said top face of said valence band layer being in contact with said bottom face of said first conduction band layer;

(iv) an adjacent second conduction band layer having a fourth index of refraction, a fourth thickness, a top and bottom face, said top face of said second conduction band layer being in contact with said bottom face of said valence band layer wherein said barrier layer and said a valence band layer are of different materials;

wherein said active region is bounded by (b) a first optical cladding layer having a fifth index of refraction, a fifth thickness, a top and bottom face, said top face of said first optical cladding layer being in contact with and adjacent to said bottom face of said second conduction layer;

(c) a second optical cladding layer having a sixth index of refraction, a sixth thickness, a top and bottom face, said bottom face of said second optical cladding layer adjacent to and in contact with said top face of said barrier layer;

(d) a substrate layer having an eighth thickness, a top and bottom face, said top face of said substrate layer being adjacent to and in contact with said bottom face of said second optical cladding layer; and (e) a means for optically pumping said active region sufficient to produce a laser output at a wavelength of greater than or equal to about 2.5 microns.

7. The laser of claim 5, wherein said substrate layer contains a substrate p-dopant.

8. The laser of claim 7 wherein said substrate p-dopant is present in a concentration between about $5 \times 10^{16}$/cc to about $1 \times 10^{19}$/cc.

9. The laser of claim 5 whereinsaid active region is lattice matched to said p-doped optical cladding layer.

10. The laser of claim 9 wherein said n-doped optical cladding layer is lattice matched to said active region.

11. The laser of claim 9, wherein each of said first index of refraction, said second index of refraction, said third index of refraction and said fourth index of refraction is between about 3.25–3.80, wherein said first thickness is between about 30–200 Å, wherein each of said second thickness and said fourth thickness is between about 11–45 Å, wherein said third thickness is between about 16–60 Å, wherein said fifth thickness is between about 1–5 micrometers, said sixth thickness is between about 0.5–5 micrometers and said active region comprises between about 1–100 of said periods.

12. The laser of claim 9, wherein each of said first index of refraction, said second index of refraction, said third index of refraction and said fourth index of refraction is between about 3.25–3.80, wherein said first thickness is between about 15–200 Å, wherein each of said second thickness and said fourth thickness is between about 15–25 Å, wherein said third thickness is between about 20–40 Å, wherein said fifth thickness is between about 2–3 micrometers, said sixth thickness is between about 1.5–3 micrometers and said active region comprises between about 10–20 of said periods.

13. The laser of claim 5 further comprising a buffer made from a material selected from the group consisting of GaSb, $Al_{1-v}As_vSb$ ($0 \leq v \leq 0.5$), AlSb, $Ga_{1-r}Al_rSb$ ($0 \leq r \leq 1$), and InAs wherein said buffer layer is inserted between said p-doped cladding layer and said substrate layer wherein said buffer layer is adjacent to and in contact with said bottom face of said p-doped optical cladding layer and said buffer layer is adjacent to and in contact with said top face of said substrate layer.

14. The laser of claim 13 wherein said buffer layer is doped with a p-dopant, said p-dopant being selected from the group consisting of Be, Si, Zn and mixtures thereof.

15. The laser of claim 14 wherein said p-dopant of said buffer layer is present in a concentration between about $5 \times 10^{16}$/cc–$1 \times 10^{19}$/cc and said buffer layer having a ninth-thickness between about 0.1–2 micrometers.

16. An electrically pumped type II quantum well laser structure comprising:
 (a) an active region further comprising one or more periods, said period further comprising:
  (i) a barrier layer having a first index of refraction, a first thickness, a top and a bottom face;
  (ii) an adjacent first conduction band layer having a second index of refraction, a second thickness, a top and bottom face, said top face of said first conduction layer being in contact with said bottom face of said top barrier layer;
  (iii) an adjacent valence band layer having a third index of refraction, a third thickness, a top and bottom face, said top face of said valence band layer being in contact with said bottom face of said first conduction band layer;
  (iv) an adjacent second conduction band layer having a fourth index of refraction, a fourth thickness, a top and bottom face, said top face of said second conduction band layer being in contact with said bottom face of said valence band layer wherein said barrier layer and said valence band layer are of different materials;
 wherein said active region is bounded by
 (b) an n-doped optical cladding layer having a fifth index of refraction, a fifth thickness, a top and bottom face, said top face of said n-doped optical cladding layer being in contact with and adjacent to said bottom face of said second conduction layer;
 (c) a p-doped optical cladding layer having a sixth index of refraction, a sixth thickness, a top and bottom face, said bottom face of said p-doped optical cladding layer adjacent to and in contact with said top face of said barrier layer;
 (d) a p-doped cap layer having a seventh thickness, a top and bottom face, said bottom face of said p-doped cap layer adjacent to and in contact with said top face of said p-doped optical cladding layer;
 (e) an n-doped substrate layer having an eighth thickness, a top and bottom face, said top face of said n-doped substrate layer being adjacent to and in contact with said bottom face of said n-doped optical cladding layer; and
 (f) a means for providing a threshold current to electrically pump said active region sufficient to produce a laser output at a wavelength of greater than or equal to about 2.5 microns.

17. The laser of claim 16, wherein said means for providing said threshold current further comprises:
 (a) a first stripe contact adjacent to and in contact with said top face of said p-doped cap layer, said stripe contact connected to a voltage bias source; and
 (b) a second stripe contact adjacent to and in contact with said bottom face of said substrate layer, said second stripe contact connected to said voltage bias source.

18. The laser of claim 16 wherein each of said fifth index of refraction and said sixth index of refraction are smaller by at least 0.1 than a weighted average of said first, said second, said third and said fourth indices of refraction.

19. The laser of claim 18 wherein
 (a) said barrier layer is made from a material selected from the group consisting of $Ga_{1-b}Al_bSb$ wherein $0.3 \leq b \leq 1.0$, AlSb, $AlSb_{1-c}As_c$ wherein $0 \leq c \leq 0.5$, $AlSb_{1-d}P_d$ wherein $0 \leq d \leq 0.5$, $Al_{1-e}In_eSb$ wherein $0 \leq e \leq 0.5$, AlGaInSb, AlGaAsSb and $InSb_{1-u}P_u$ wherein $0.2 \leq u \leq 0.8$;
 (b) said cap layer is made from a material selected from the group consisting of GaSb, $GaI_{1-x}Al_xSb$ wherein $0 \leq x \leq 0.7$, and InAs;
 (c) each of said n-doped and said p-doped optical cladding layers are made from a material selected from the group consisting of AlSb, $Al_{1-y}Ga_ySb$ wherein $0 \leq y \leq 0.5$, $AlSb_{1-z}As_z$ wherein $0 \leq x \leq 0.5$, $AlSb_{1-a}P_a$ wherein $0 \leq a \leq 0.5$, AlGaInSb, AlGaAsSb, and an InAs/AlSb superlattice;
 (d) each of said first and second conduction band layers are made from a material selected from the group consisting of InAs, $InAs_{1-f}Sb_f$ wherein $0 \leq f \leq 0.5$, $InAs_{1-g}P_g$ wherein $0 \leq g \leq 0.5$, $In_{1-h}Al_hAs$ wherein $0 \leq h \leq 0.5$, $In_{1-i}Ga_iAs$ wherein $0 \leq i \leq 0.5$, and InAlAsSb;
 (e) said valence band layer is made from a material selected from the group consisting of $Ga_{1-q}In_qSb$ wherein $0 \leq q \leq 0.6$, GaSb, GaInSbAs, and GaInAlSb;
 (f) said substrate layer is made from a material selected from the group conssiting of GaSb, InAs, InP, and GaAs; and
 (g) each of said first and second stripe contacts are metallic.

20. The laser of claim 19 wherein
 (a) said cap layer is doped with p-dopants selected from the group consisting of Be, Zn, Si and mixtures thereof,
 (b) said n-doped cladding layer is doped with n-dopants selected from the group consisting of Te, Se, Si and mixtures thereof; and
 (c) said p-doped cladding layer is doped with p-dopants selected from the group consisting of Be, Zn, Si and mixtures thereof.

21. The laser of claim 20 wherein said substrate layer is doped with a substrate n-dopant.

22. The laser of claim 21 wherein said substrate n-dopant is present in a concentration between about $5\times10^{16}$/cc to about $1\times10^{19}$/cc.

23. The laser of claim 20 wherein said active region is lattice matched to said n-doped optical cladding layer.

24. The laser of claim 23 wherein said p-doped optical cladding layer is lattice matched to said active region.

25. The laser of claim 23, wherein each of said first index of refraction, said second index of refraction, said third index of refraction and said fourth index of refraction is between about 3.25–3.80, wherein said first thickness is between about 15–200 Å, wherein each of said second thickness and said fourth thickness is between about 11–45 Å, wherein said third thickness is between about 16–60 Å, wherein said fifth thickness is between about 1–5 micrometers, said sixth thickness is between about 0.5–5 micrometers and said active region comprises between about 1–100 of said periods.

26. The laser of claim 23, wherein each of said first index of refraction, said second index of refraction, said third index of refraction and said fourth index of refraction is between about 3.25–3.80, wherein said first thickness is between about 15–200 Å, wherein each of said second thickness and said fourth thickness is between about 15–25 Å, wherein said third thickness is between about 20–40 Å, wherein said fifth thickness is between about 2–3 micrometers, said sixth thickness is between about 1.5–3 micrometers and said active region comprises between about 10–20 of said periods.

27. The laser of claim 20 further comprising a buffer made from a material selected from the group consisting of GaSb, $Al_{1-v}As_vSb$ ($0 \leq v \leq 0.5$), AlSb, $Ga_{1-r}Al_rSb$ ($0 \leq r \leq 1$), and InAs wherein said buffer layer is inserted between said p-doped cladding layer and said substrate layer wherein said buffer layer is adjacent to and in contact with said bottom face of said n-doped optical cladding layer and said buffer layer is adjacent to and in contact with said top face of said substrate layer.

28. The laser of claim 27 wherein said buffer layer is doped with an n-dopant, said n-dopant being selected from the group consisting of Te, Se, Si, and mixtures thereof.

29. The laser of claim 28 wherein said n-dopant of said buffer layer is present in a concentration between about $5\times10^{16}$/cc–$1\times10^{19}$/cc and said buffer layer having a ninth-thickness between about 0.1–2 micrometers.

* * * * *